United States Patent
Sato et al.

(10) Patent No.: US 10,212,401 B2
(45) Date of Patent: Feb. 19, 2019

(54) IMAGE GENERATION DEVICE AND IMAGING DEVICE

(71) Applicant: Panasonic Intellectual Property Management Co., Ltd., Osaka (JP)

(72) Inventors: Satoshi Sato, Kyoto (JP); Takeo Azuma, Kyoto (JP); Kunio Nobori, Osaka (JP); Hisashi Watanabe, Osaka (JP); Takamasa Ando, Osaka (JP); Nobuhiko Wakai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/841,513

(22) Filed: Dec. 14, 2017

(65) Prior Publication Data

US 2018/0184052 A1 Jun. 28, 2018

(30) Foreign Application Priority Data

Dec. 27, 2016 (JP) .................................. 2016-254420

(51) Int. Cl.
| | |
|---|---|
| *H04N 9/04* | (2006.01) |
| *H01L 27/146* | (2006.01) |
| *G02F 1/1335* | (2006.01) |
| *G02B 5/04* | (2006.01) |
| *G02B 5/20* | (2006.01) |
| *G02B 5/02* | (2006.01) |

(Continued)

(52) U.S. Cl.
CPC ........... *H04N 9/045* (2013.01); *G02B 5/0242* (2013.01); *G02B 5/0278* (2013.01); *G02B 5/201* (2013.01);
(Continued)

(58) Field of Classification Search
CPC ........ H04N 9/045; H04N 9/083; H04N 9/735; H04N 19/186;
(Continued)

(56) References Cited

U.S. PATENT DOCUMENTS

| 5,629,734 A | 5/1997 | Hamilton, Jr. et al. |
| 8,187,726 B2 * | 5/2012 | Sasaki ................... B82Y 20/00 |
| | | 252/301.16 |

(Continued)

FOREIGN PATENT DOCUMENTS

| JP | 2000-308070 | 11/2000 |
| JP | 2000-357785 | 12/2000 |
| WO | 2011/063311 | 5/2011 |

OTHER PUBLICATIONS

Leonid I. Rudin et al., "Nonlinear total variation based noise removal algorithms", Physica D, vol. 60, Nov. 1992, pp. 259-268.

(Continued)

*Primary Examiner* — Lin Ye
*Assistant Examiner* — Chriss S Yoder, III
(74) *Attorney, Agent, or Firm* — Wenderoth, Lind & Ponack, L.L.P.

(57) ABSTRACT

An imaging system serving as an image generation device is provided with: a random optical filter array that has a plurality of types of optical filters and a scattering unit; photodiodes that receive light transmitted through the random optical filter array; an AD conversion unit that converts the light received by the photodiodes, into digital data; and a color image generation circuit that generates an image, using the digital data and modulation information of the random optical filter array, in which the scattering unit is located between the plurality of types of optical filters and the photodiodes, and in which the scattering unit includes a material having a first refractive index, and a material having a second refractive index that is different from the first refractive index.

11 Claims, 14 Drawing Sheets

(51) Int. Cl.
*H04N 9/73* (2006.01)
*H04N 9/083* (2006.01)
(52) U.S. Cl.
CPC .. *G02F 1/133504* (2013.01); *H01L 27/14601* (2013.01); *H01L 27/14621* (2013.01); *H04N 9/083* (2013.01); *H04N 9/735* (2013.01)
(58) Field of Classification Search
CPC .. H04N 2209/045–2209/047; G02F 1/133504; G02F 1/335; G02B 5/201; G02B 5/0242; G02B 5/0278; G02B 6/004–6/0043; G06T 3/40–3/4092; G06T 3/4015; H01L 27/14601; H01L 27/1462; H01L 27/14621; H01L 27/14625
See application file for complete search history.

(56) References Cited

U.S. PATENT DOCUMENTS

| | | | | |
|---|---|---|---|---|
| 9,853,073 | B2* | 12/2017 | Roh | H01L 27/14621 |
| 2009/0316014 | A1* | 12/2009 | Lim | H04N 5/2254 |
| | | | | 348/222.1 |
| 2010/0118172 | A1* | 5/2010 | McCarten | H01L 27/14621 |
| | | | | 348/302 |
| 2011/0142339 | A1* | 6/2011 | Singh | H04N 9/07 |
| | | | | 382/166 |
| 2014/0078355 | A1* | 3/2014 | Hiramoto | H01L 27/14629 |
| | | | | 348/273 |
| 2015/0116531 | A1 | 4/2015 | Sato et al. | |

OTHER PUBLICATIONS

Shunsuke Ono et al., "Decorrelated Vectorial Total Variation", IEEE Conference on Computer Vision and Pattern Recognition, Jun. 2014.

Jianwei Ma, "Improved Iterative Curvelet Thresholding for Compressed Sensing and Measurement", IEEE Transactions on Instrumentation and Measurement, vol. 60, No. 1, Jan. 2011, pp. 126-136.

Michal Aharon et al., "K-SVD: An Algorithm for Designing Overcomplete Dictionaries for Sparse Representation", IEEE Transactions on Signal Processing, vol. 54, No. 11, Nov. 2006, pp. 4311-4322.

* cited by examiner

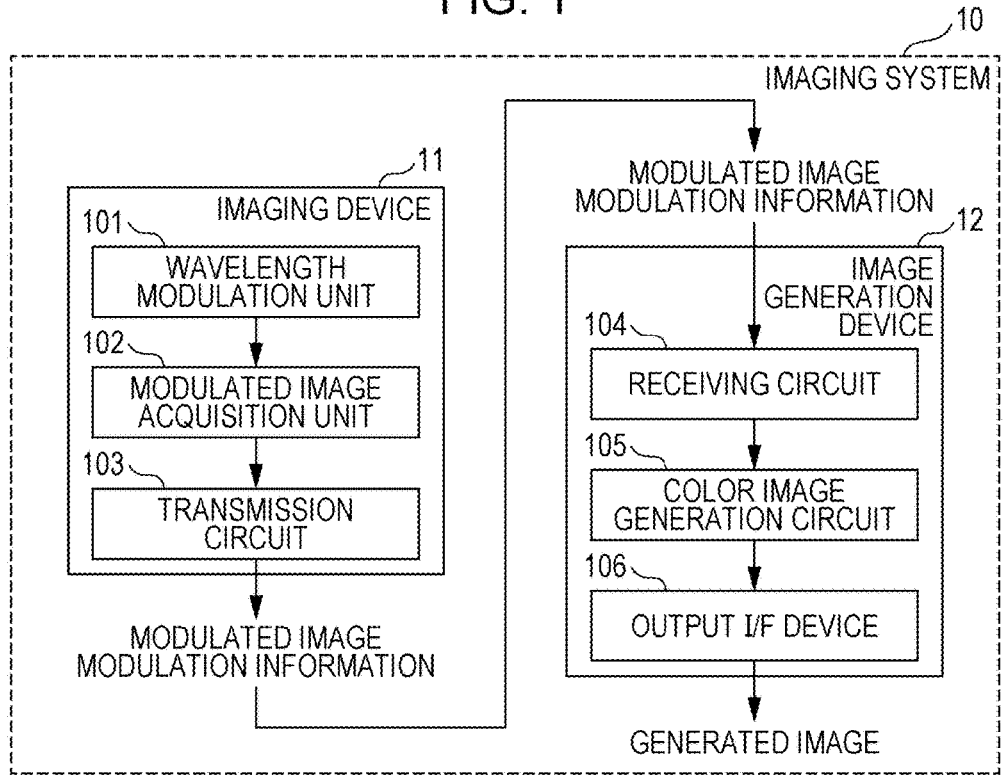
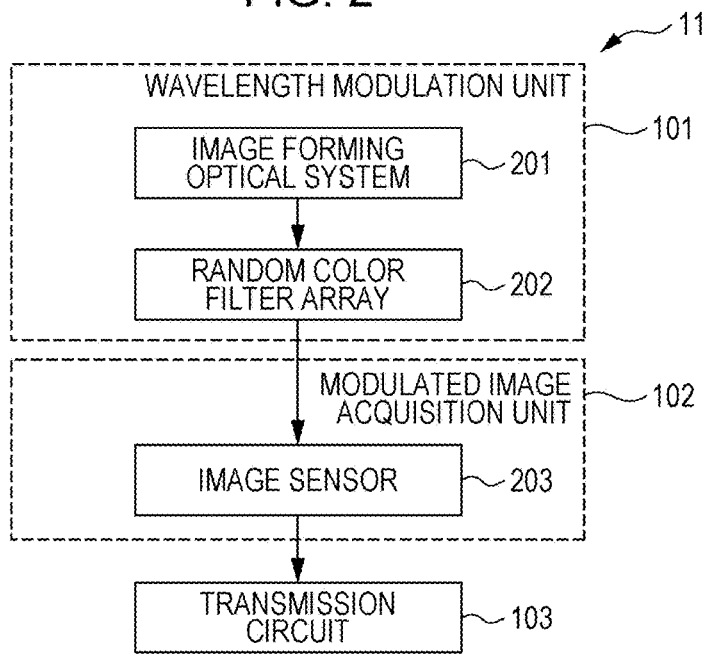

FIG. 13A

| $y_4$ | $y_8$ | $y_{12}$ | $y_{16}$ |
|---|---|---|---|
| $y_3$ | $y_7$ | $y_{11}$ | $y_{15}$ |
| $y_2$ | $y_6$ | $y_{10}$ | $y_{14}$ |
| $y_1$ | $y_5$ | $y_9$ | $y_{13}$ |

FIG. 13B

| $r_4$ | $r_8$ | $r_{12}$ | $r_{16}$ |
|---|---|---|---|
| $r_3$ | $r_7$ | $r_{11}$ | $r_{15}$ |
| $r_2$ | $r_6$ | $r_{10}$ | $r_{14}$ |
| $r_1$ | $r_5$ | $r_9$ | $r_{13}$ |

FIG. 13C

| $g_4$ | $g_8$ | $g_{12}$ | $g_{16}$ |
|---|---|---|---|
| $g_3$ | $g_7$ | $g_{11}$ | $g_{15}$ |
| $g_2$ | $g_6$ | $g_{10}$ | $g_{14}$ |
| $g_1$ | $g_5$ | $g_9$ | $g_{13}$ |

FIG. 13D

| $b_4$ | $b_8$ | $b_{12}$ | $b_{16}$ |
|---|---|---|---|
| $b_3$ | $b_7$ | $b_{11}$ | $b_{15}$ |
| $b_2$ | $b_6$ | $b_{10}$ | $b_{14}$ |
| $b_1$ | $b_5$ | $b_9$ | $b_{13}$ |

PSNR = 37.59 [dB]

PSNR = 38.61 [dB]

| R | G | R | G | R | G | R | G |
|---|---|---|---|---|---|---|---|
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |

IMAGE GENERATION DEVICE AND IMAGING DEVICE

BACKGROUND

1. Technical Field

The present disclosure relates to an image generation device and the like in which a compressed sensing technique is used.

2. Description of the Related Art

In order to capture a color image, it is necessary to acquire information regarding the three different wavelength regions of red (R), green (G), and blue (B) that correspond to the three primary colors of light. There are color imaging devices that acquire information regarding R, G, and B using three image sensors. However, many color imaging devices are equipped with only one image sensor in order to reduce size and cost. Therefore, many color imaging devices acquire information regarding R, G, and B using one image sensor.

There is a conventionally known method in which information regarding one wavelength region from among R, G, and B is acquired for each pixel, and information regarding the three wavelength regions of R, G, and B is acquired for each pixel by carrying out processing referred to as demosaicing.

FIG. 18 is a schematic drawing depicting a widely used Bayer array (for example, the specification of U.S. Pat. No. 5,629,734). In a Bayer array, pixels for G, which is close to the visual characteristics of a human, take up ½ of all of the pixels, and pixels for R and B each take up ¼ of all of the pixels. Information regarding the three wavelength regions of R, G, and B is then acquired for all of the pixels by means of demosaicing processing.

Meanwhile, Japanese Unexamined Patent Application Publication (Translation of PCT Application) No. 2013-511924 discloses a technique in which demosaicing is carried out by arranging color filter elements in a random color pattern and applying a compressed sensing technique to a sample data set.

However, in the methods of the specification of U.S. Pat. No. 5,629,734 and Japanese Unexamined Patent Application Publication (Translation of PCT Application) No. 2013-511924, only information regarding one wavelength region from among R, G, and B is acquired in each pixel of an image sensor. Therefore, the resolution of the color image subsequent to demosaicing may decline and artifacts referred to as false color may occur.

SUMMARY

One non-limiting and exemplary embodiment provides an image generation device that is capable of generating an appropriate image with a decline in resolution being suppressed. Furthermore, the present disclosure provides an imaging device that is used in order to generate an appropriate image. Additional benefits and advantages of the aspects of the present disclosure will become apparent from the present specification and drawings. The benefits and/or advantages may be individually provided by the various aspects and features disclosed in the present specification and drawings, and need not all be necessary in order to obtain one or more of the same.

In one general aspect, the techniques disclosed here feature an image generation device provided with: a random optical filter array that has a plurality of types of optical filters and a scattering unit; photodiodes that receive light transmitted through the random optical filter array; an AD conversion unit that converts the light received by the photodiodes, into digital data; and a generation circuit that generates an image, using the digital data and modulation information of the random optical filter array, in which the scattering unit is located between the plurality of types of optical filters and the photodiodes, and in which the scattering unit includes a material having a first refractive index, and a material having a second refractive index that is different from the first refractive index.

General and specific aspects of the aforementioned may be implemented using a device, a system, a method, and a computer program, or may be realized using a combination of a device, a system, a method, and a computer program.

According to the present disclosure, a decline in resolution can be suppressed and an appropriate image can be generated. Additional benefits and advantages of the aspects of the present disclosure will become apparent from the present specification and drawings. The benefits and/or advantages may be individually provided by the various aspects and features disclosed in the present specification and drawings, and need not all be necessary in order to obtain one or more of the same.

BRIEF DESCRIPTION OF THE DRAWINGS

FIG. 1 is a schematic drawing depicting a configuration of an imaging system according to embodiment 1;

FIG. 2 is a drawing depicting details of a configuration of a wavelength modulation unit and a modulated image acquisition unit in the imaging system;

FIGS. 13A to 13D are schematic drawings depicting a modulated image and generated images in a case where the number of pixels of an imaging sensor is N=16;

FIG. 17 is a schematic drawing depicting a generated image (a multi-band image) in a case where the number of pixels of an imaging sensor is N=16; and FIG. 18 is a schematic drawing depicting a Bayer array.

Figure 3:
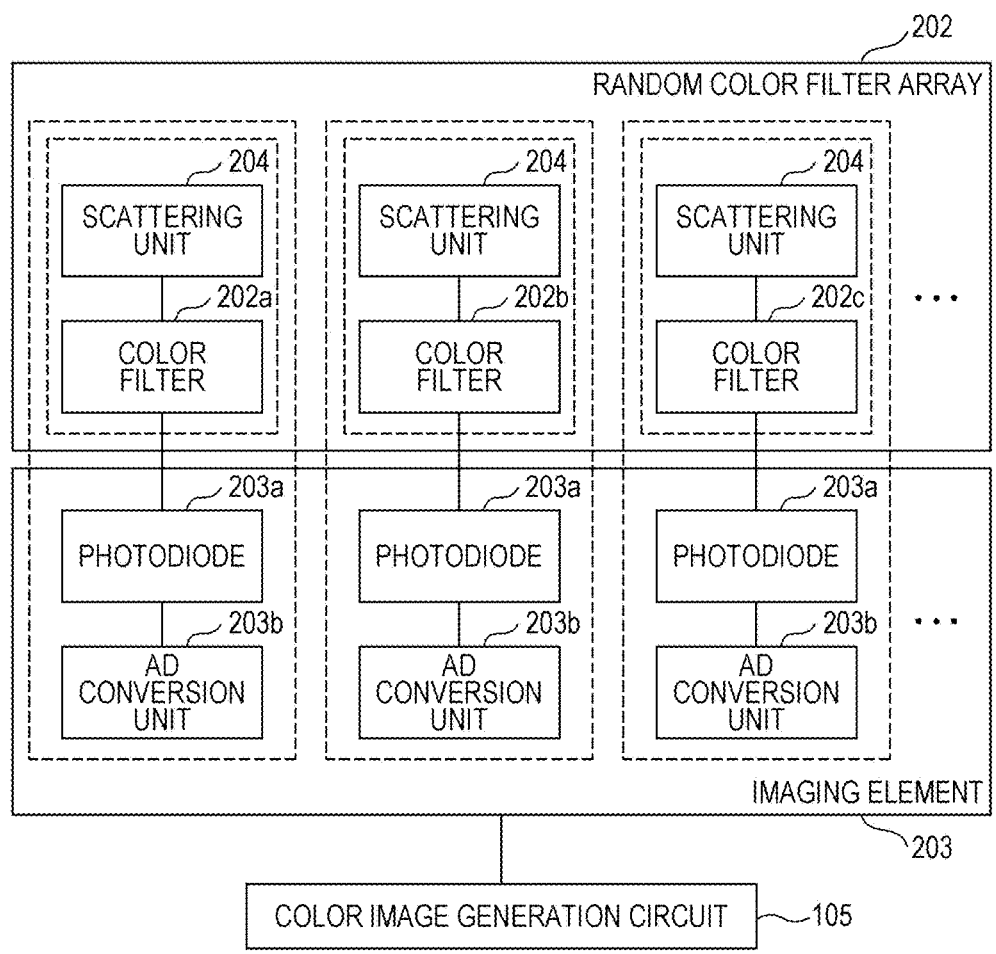
FIG. 3 is a schematic drawing depicting a configuration of a random color filter array and an imaging sensor in the imaging system.

DETAILED DESCRIPTION (Findings Forming the Basis for the Present Disclosure)

In the specification of U.S. Pat. No. 5,629,734 and Japanese Unexamined Patent Application Publication (Translation of PCT Application) No. 2013-511924, only information regarding any one of R (red), G (green), and B (blue) is acquired in one pixel. Therefore, the acquired information is not always sufficient, and there is a possibility that an appropriate image having a high resolution may not be generated.

In contrast, for example, information regarding each wavelength band of R, G, and B is mixed and given to each pixel, and this mixing is carried out randomly with respect to pixel groups, and therefore more information can be obtained from each pixel, and an appropriate image can be generated by means of a compressed sensing technique from the obtained information. It is useful for the mixing of random information to be realized in a pseudo manner with respect to pixel groups using few types of optical filters, such as a total of three types of color filters or the like including an R filter that primarily transmits the R wavelength band, a G filter that primarily transmits the G wavelength band, and a B filter that primarily transmits the B wavelength band, for example. For instance, a random optical filter array is installed and imaging is carried out, the random optical filter array being configured by arranging a scattering unit that causes light to scatter and optical filters of relatively few types on the optical path of light received by an imaging sensor. Thus, light transmitted through each optical filter is received not only in one pixel but also in nearby pixels due to a scattering phenomenon, and a large amount of information is given to each pixel; therefore, it can become possible to generate an appropriate image having a high resolution. In this way, different from conventional techniques in which color mixing is prevented with only information regarding any one of R, G, and B being given in a pixel, the technique according to the present disclosure is able to generate an image having a high resolution by using a scattering unit to cause, for example, color mixing or the like to occur by means of a scattering phenomenon. Hereinafter, an image generation device and the like according to the present disclosure will be described on the basis of the above finding.

An image generation device according to an aspect of the present disclosure is provided with: a random optical filter array that has a plurality of types of optical filters and a scattering unit; photodiodes that receive light transmitted through the random optical filter array; an AD conversion unit that converts the light received by the photodiodes, into digital data; and a generation circuit that generates an image, using the digital data and modulation information of the random optical filter array, in which the scattering unit is located between the plurality of types of optical filters and the photodiodes, or in front of the plurality of types of optical filters, and in which the scattering unit includes a material having a first refractive index, and a material having a second refractive index that is different from the first refractive index. Here, optical filters of the same type have the same wavelength characteristics pertaining to the relationship between the wavelength of light and light transmittance, and optical filters of mutually different types have different wavelength characteristics pertaining to the relationship between the wavelength of light and light transmittance. The scattering unit is located between the plurality of types of optical filters and the photodiodes, and is arranged on an optical path along which light that has passed through an optical member such as a lens, for example, reaches a light-receiving surface. The modulation information of the random optical filter array is information relating to light transmittance in the random optical filter array, which has the plurality of optical filters arranged on an approximate plane and includes the scattering unit, and the light transmittance can change in accordance with the position on the plane and the wavelength of the light. It should be noted that the modulation information relates also to a point-spread function corresponding to the scattering unit, and the point-spread function can change in accordance with the position on the plane.

Thus, light transmitted through the plurality of types of optical filters, which have mutually different wavelength characteristics pertaining to the relationship between the wavelength of light and transmittance, diffuses and is received by the photodiodes, and the photodiodes, which serve as pixels, are able to acquire sufficient information; therefore, a decline in resolution can be suppressed and an appropriate image can be generated.

Furthermore, for example, the optical filters may be color filters, the random optical filter array may be a random color filter array, and the image generated by the generation circuit may be a color image.

Thus, light transmitted through each of a set of a plurality of color filters such as an R filter, a G filter, and a B filter, for example, is added in a photodiode group of nearby pixels due to a scattering phenomenon, and an appropriate color image having a high resolution can be generated by means of a compressed sensing technique, for example, on the basis of the modulation information.

Furthermore, for example, the scattering unit may have a first layer constituted of the material having the first refractive index, and particles, which include the material having the second refractive index, scattered in the first layer.

Thus, due to the scattering of light that passes through the layer in which the particles are scattered in the random optical filter array, the information amount of light acquired in pixel units is greater than when the light is not made to scatter. In the generation circuit, the modulation information that includes information pertaining to the point-spread function corresponding to position is used in accordance with the scattering, and an appropriate image having a high resolution can therefore be obtained.

Furthermore, for example, the second refractive index may be 1.9 or more.

Thus, it is possible for scattering that is sufficient in terms of practical use to occur, and therefore a random optical filter array having sufficient randomness is realized, and it can become possible to generate an appropriate image by means of compressed sensing.

Furthermore, for example, the particles may be constituted of SiN, $TiO_2$, $ZrO_2$, ZnO, or $Ta_2O_5$.

Thus, a random optical filter array that is useful can be configured relatively easily.

Furthermore, for example, the particle size of the particles may be 500 nm or more and 1000 nm or less.

Thus, it becomes possible for visible light to be sufficiently scattered by the scattering unit, and it can thereby become possible to generate a color image or the like having a high resolution.

Furthermore, for example, the scattering unit may include a first layer constituted of the material having the first refractive index, and a second layer constituted of the material having the second refractive index, and the first layer and the second layer may be stacked in the thickness direction of the random optical filter array.

Thus, scattering is able to occur due to refraction of the light that passes through the layers of the scattering unit in the random optical filter array, and therefore the information amount of light acquired in pixel units can become greater than when a conventional Bayer array or the like is used. Therefore, an appropriate image having a high resolution can be generated.

Furthermore, for example, the image generated by the generation circuit may be a multi-band image.

Thus, a multi-band image having a high resolution can be generated. It should be noted that, for example, the random optical filter array may be configured including an optical filter that transmits light of a wavelength band other than visible light.

Furthermore, for example, the generation circuit may generate the image, using a compressed sensing technique.

An image can be appropriately generated by means of this compressed sensing.

Furthermore, an imaging device according to an aspect of the present disclosure is provided with: a random optical filter array that has a plurality of types of optical filters and a scattering unit; photodiodes that receive light transmitted through the random optical filter array; and an AD conversion unit that converts the light received by the photodiodes, into digital data, in which the scattering unit is located between the plurality of types of optical filters and the photodiodes, and in which the scattering unit includes a material having a first refractive index, and a material having a second refractive index that is different from the first refractive index.

Thus, light transmitted through the plurality of types of optical filters, which have mutually different wavelength characteristics pertaining to the relationship between the wavelength of light and transmittance, diffuses and is received by the photodiodes, and it becomes possible for the photodiodes serving as pixels to acquire sufficient information. Therefore, an appropriate image having a relatively high resolution can be generated using information of each pixel.

It should be noted that various types of general or specific aspects hereof include combinations of one or more of a device, a system, a method, an integrated circuit, a computer program, a computer-readable recording medium, or the like.

Hereinafter, embodiments of an imaging system pertaining to an image generation device in the present disclosure will be described with reference to the drawings. The embodiments given here are all merely examples. Consequently, the numerical values, the shapes, the materials, the constituent elements, the arrangement and modes of connection of the constituent elements, the steps, the order of the steps, and the like given in the following embodiments are examples and are not restrictive. From among the constituent elements in the following embodiments, constituent elements that are not mentioned in the independent claims are constituent elements that may be optionally added. Furthermore, the drawings are schematic drawings and are not always depicted in an exact manner.

Embodiment 1

FIG. 1 depicts a configuration of an imaging system 10 according to the present embodiment. The imaging system 10 is provided with an imaging device 11 and an image generation device 12.

The imaging device 11 has a wavelength modulation unit 101, a modulated image acquisition unit 102, and a transmission circuit 103. Meanwhile, the image generation device 12 has a receiving circuit 104, a color image generation circuit 105, and an output I/F (interface) device 106. The imaging device 11 and the image generation device 12 may be integrated. It goes without saying that, in a case where the imaging device 11 and the image generation device 12 are integrated, the transmission circuit 103 and the receiving circuit 104 can be omitted.

(Imaging Device 11)

First, the imaging device 11 will be described with reference to FIG. 2.

FIG. 2 depicts details of a configuration of the wavelength modulation unit 101 and the modulated image acquisition unit 102.

As depicted in FIG. 2, the wavelength modulation unit 101 corresponds to an image forming optical system 201 and a random color filter array 202. Furthermore, the modulated image acquisition unit 102 corresponds to an imaging sensor 203.

(Image Forming Optical System 201)

The image forming optical system 201 has, at least, one or more lenses and a lens position adjustment mechanism (neither of which are depicted). The one or more lenses collect light from an object for an image of an optical signal to be formed. The optical signal represents an image of the object. The lens position adjustment mechanism is, for example, a control circuit (a controller) that controls an actuator for adjusting the image formation position implemented by the lenses and the drive amount of the actuator. It should be noted that the lens position adjustment mechanism is not necessary in a case where the focal point of the one or more lenses is fixed. Furthermore, an image of an optical signal may be formed without using a lens, as in a pinhole camera.

The image forming optical system 201 may be referred to as an optical system.

(Imaging Sensor 203)

FIG. 3 depicts an example of details of a configuration of the random color filter array 202 and the imaging sensor 203.

The imaging sensor 203 is configured including a plurality of photodiodes 203a and at least one AD conversion unit 203b.

Optical signals of which images have been formed by the image forming optical system 201 are received by the photodiodes 203a and are converted into electrical signals by the AD conversion unit 203b. The electrical signals represent a modulated image, which is an image that has been modulated for each pixel. In other words, the imaging sensor 203 captures a modulated image. The imaging sensor 203 is arranged at the position of the focal length of the lenses.

The imaging sensor 203 includes a plurality of pixels that receive light collected by the optical system and output electrical signals. The pixels correspond to the photodiodes 203a. The plurality of photodiodes 203a of the imaging sensor 203 and the plurality of electrical signals have a one-to-one relationship.

(Random Color Filter Array 202)

The random color filter array 202 is made up of a plurality of types of color filters 202a to 202c and a scattering unit 204. The random color filter array 202, for example, is provided with: a color filter assembly formed by the color filters 202a to 202c being arranged in plurality in mutually different positions on an approximate plane; and the scattering unit 204. The random color filter array 202 is arranged in front of the photodiodes 203a, that is, on an optical path along which light that is incident from the image forming optical system 201 reaches the imaging sensor 203 (for example, in front of light-incoming surfaces of the photodiodes 203a). In the random color filter array 202, the plurality of types of color filters 202a to 202c are arranged on an optical path along which light that is incident from the image forming optical system 201 reaches the light-receiving surfaces of the photodiodes 203a. The scattering unit 204 is arranged between the image forming optical system 201 and the photodiodes 203a. The scattering unit 204 may be arranged in front of the color filters 202a to 202c, in other words, the color filters 202a to 202c may be arranged between the scattering unit 204 and the imaging sensor 203, or the scattering unit 204 may be arranged to the rear of the color filters 202a to 202c and in front of the imaging sensor 203, in other words, the scattering unit 204 may be arranged between the color filters 202a to 202c and the imaging sensor 203. Here, a description will be given primarily using an example in which the scattering unit 204 is arranged in front of the color filters 202a to 202c, in other words, the color filters 202a to 202c are arranged between the scattering unit 204 and the image forming optical system 201.

The color filters 202a to 202c are color filters of mutually different types (that is, wavelength characteristics pertaining to the relationship between the wavelength of light and transmittance). As an example, the color filter 202a of one type is an R filter that primarily transmits light of the R wavelength band, the color filter 202b of another one type is a G filter that primarily transmits light of the G wavelength band, and the color filter 202c of yet another one type is a B filter that primarily transmits light of the B wavelength band.

The example of FIG. 3 depicts that one color filter from among the three types of color filters 202a to 202c is arranged corresponding to one of the photodiodes 203a in the random color filter array 202. The arrangement of the various types of color filters 202a to 202c on a two-dimensional plane (that is, a two-dimensional array) can be, for example, that of a Bayer array (see FIG. 18) or the like.

The random color filter array 202 may be arranged in contact with the front surface, namely the light-receiving surface, of the imaging sensor 203, or may be arranged in front of the imaging sensor 203, spaced apart from the front surface. It should be noted that, as described later on, the color filters 202a to 202c in the random color filter array 202 are, for example, arranged spaced apart from the imaging sensor 203.

The random color filter array 202 is used for filtering light that is incident on the imaging sensor 203, in a specific wavelength band. An image captured using the random color filter array 202 is referred to as a modulated image. The random color filter array 202 has different light transmittances and different point-spread functions at arbitrary positions where light is transmitted. A "position" mentioned here means a position of a minute region having a fixed area. A point-spread function is a response function for a point light source in an imaging system. Assuming that the random color filter array 202 including the substantially planar-shaped color filters 202a to 202c has a substantially planar shape, the light transmittance and point-spread function may be different at each position of the minute regions on that plane. In other words, the light transmittance and point-spread function may not be the same at all of the positions of the minute regions on the plane of the random color filter array 202, and the light transmittance and point-spread function may be the same in at least two positions from among all of the positions of the minute regions on the plane of the random color filter array 202. The light transmittance and point-spread function for each position such as the aforementioned are decided by the wavelength characteristics of the plurality of types of color filters 202a to 202c that make up the random color filter array 202, the positions of the color filters 202a to 202c, a substance (for example, a resin, glass, or the like) having a first refractive index constituting the scattering unit 204 as described later on, and the composition and arrangement of a substance having a second refractive index that is different from the first refractive index, and the light transmittance and point-spread function are referred to as modulation information. The areas of the minute regions may be equal to the light-receiving areas of the photodiodes 203a of the imaging sensor 203, or may be smaller than the light-receiving areas, for example. It should be noted that the light transmittance may also be different depending on the transmitted wavelength (wavelength band).

The plurality of photodiodes 203a and the positions of the aforementioned plurality of minute regions pertaining to the random color filter array 202 may have a one-to-one relationship.

Further details of the random color filter array 202 will be described later on.

(Transmission Circuit 103)

The transmission circuit 103 transmits, to the image generation device 12, a modulated image captured by the imaging sensor 203, and modulation information that has been set corresponding to the random color filter array 202. The modulation information indicates the light transmittance and point-spread function as wavelength characteristics of each position. Either of wired communication and wireless communication may be carried out for the transmission.

It should be noted that, in the present embodiment, it is assumed that the imaging system 10 is provided with the transmission circuit 103 and the receiving circuit 104, and carries out processing with modulated images and modulation information being transmitted and received in near real time. However, the imaging system 10 may be provided with a storage device (for example, a hard disk drive) that saves modulated images and modulation information, and may carry out processing in non-real time.

(Image Generation Device 12)

Once again referring to FIG. 1, the receiving circuit 104, the color image generation circuit 105, and the output interface device 106 of the image generation device 12 will be described.

(Receiving Circuit 104)

The receiving circuit 104 receives a modulated image and modulation information that are output from the imaging device 11. Communication between the receiving circuit 104 and the transmission circuit 103 may be wired communication or wireless communication. It should be noted that, even if the transmission circuit 103 transmits a modulated image and modulation information by wired communication, the receiving circuit 104 may receive these items of information wirelessly by way of a device that converts the wired communication into wireless communication. The same is also true for the opposite thereof.

(Color Image Generation Circuit 105)

The color image generation circuit 105 generates a color image using a modulated image and modulation information received by the receiving circuit 104. Details of processing for generating a color image (color image generation processing) will be described later on. The color image generation circuit 105 sends the generated color image to the output interface device 106.

(Output Interface Device 106)

The output interface device 106 is a video output terminal or the like. The output interface device 106 outputs the color image to outside of the image generation device 12 as a digital signal or as an analog signal.

(Details of Random Color Filter Array 202)

Next, the random color filter array 202 will be described in more detail with reference to FIGS. 4 to 7A.

Figure 4:
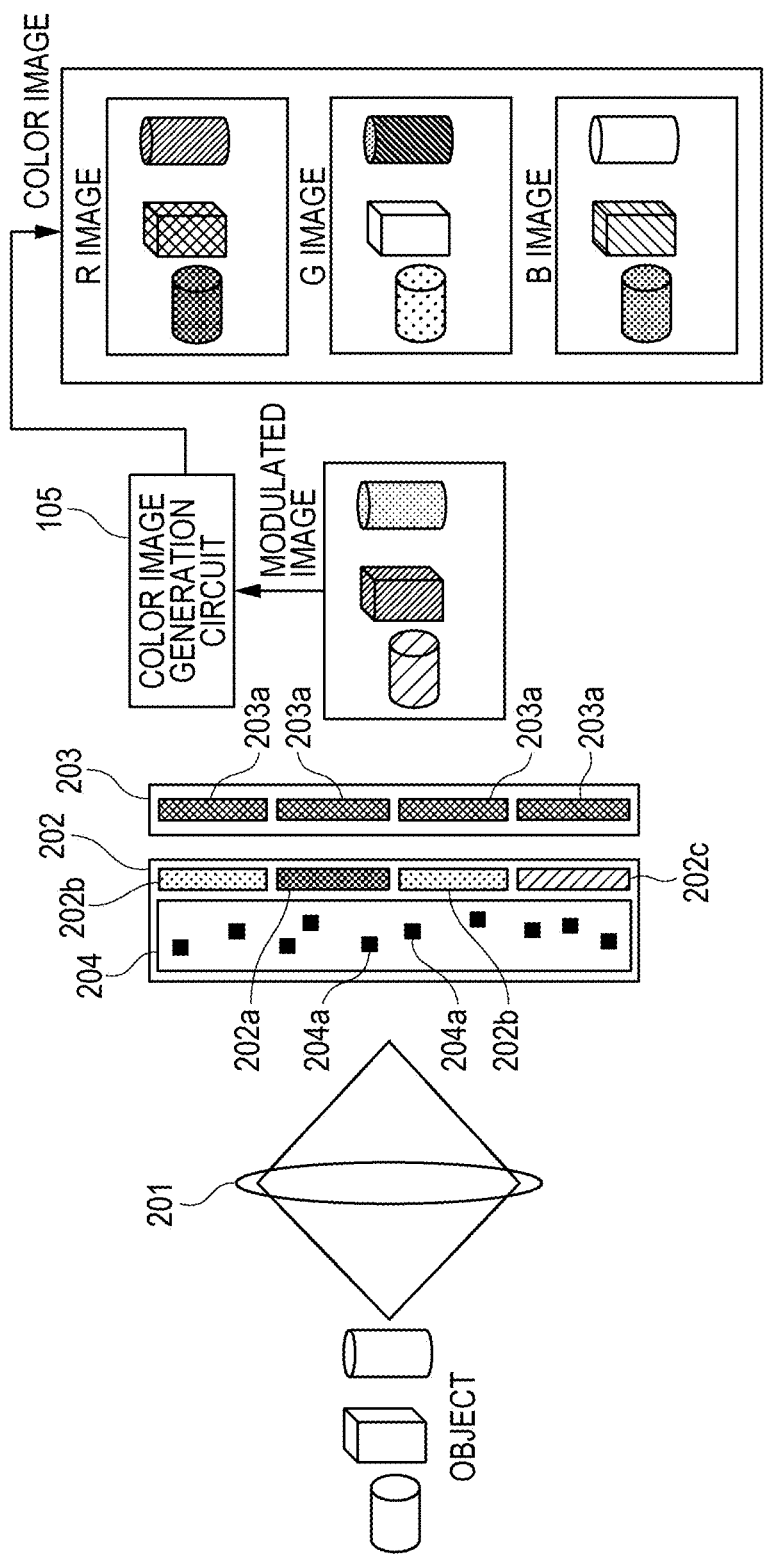
FIG. 4 is a schematic drawing of the imaging system including the random color filter array.

FIG. 4 is a schematic drawing of the imaging system 10 including the random color filter array 202.

As mentioned above, the random color filter array 202 has a light transmittance and point-spread function that may differ according to the position and according to the wavelength band. That is, at each of a plurality of arbitrary positions at which light of a plurality of wavelength bands is transmitted, the combinations of the light transmittance and point-spread function in each wavelength band are different from each other. In order to realize optical characteristics such as these, the random color filter array 202 of the present embodiment has: the plurality of types of color filters 202a to 202c, which have mutually different light transmittances that correspond to wavelength bands of light; and the scattering unit 204. Furthermore, the types of the color filters arranged in each position may be different in the random color filter array 202. In other words, color filters of mutually different types can be arranged in each position corresponding to the mutually close plurality of photodiodes 203a. In other words, the types of color filters may not be the same at all of the plurality of positions of the random color filter array 202 that correspond to the plurality of photodiodes 203a, and the types of color filters may be the same in at least two positions from among the plurality of positions of the random color filter array 202. The color filters 202a to 202c may be arranged regularly as in a conventional Bayer array (see FIG. 18) or may be arranged randomly. It should be noted that the color filters may partially overlap with each other when viewed from the front of the photodiodes 203a in the imaging sensor 203; however, a decrease in the amount of light received by the photodiodes 203a can be suppressed by the color filters not overlapping with each other, as in the example of FIG. 4.

In FIG. 4, an example is given in which the random color filter array 202 includes the three types of color filters 202a to 202c with one color filter corresponding to one photodiode 203a; however, it should be noted that this is merely an example, and the number of types of the color filters is not restricted to three, and the number of color filters arranged corresponding to one photodiode 203a is also not restricted to one.

Figure 5:
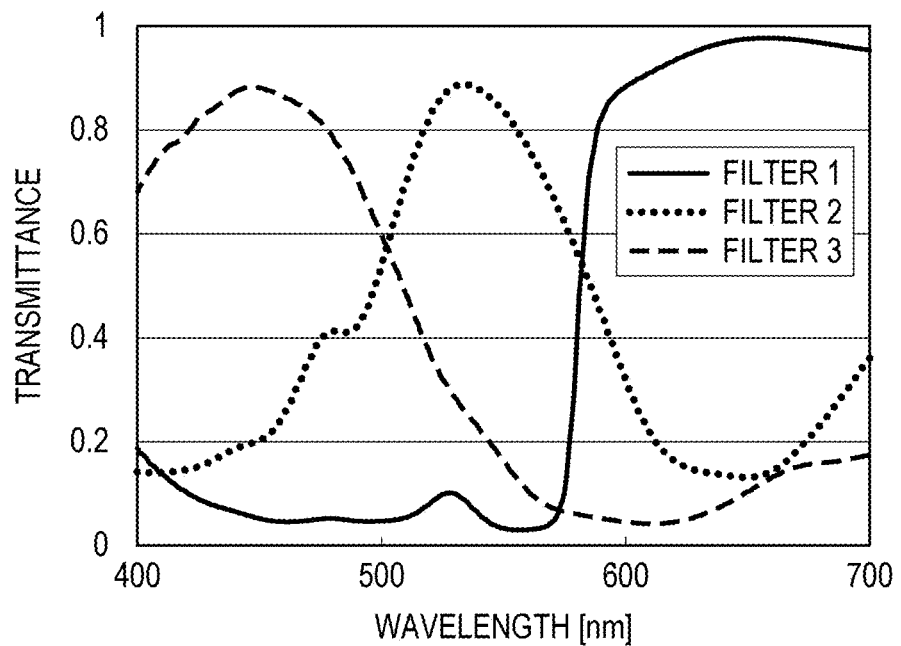
FIG. 5 is a drawing depicting transmittance as a wavelength characteristic of three types of filters according to an embodiment.

FIG. 5 is a drawing depicting light transmittance as wavelength characteristics of the three types of color filters 202a to 202c. In the same drawing, filter 1 is the color filter 202a, filter 2 is the color filter 202b, and filter 3 is the color filter 202c.

The wavelength characteristics of the filters indicate the extent to which light that is incident on a filter is reflected, transmitted, or absorbed, in accordance with the wavelength. The sum total of reflected light, transmitted light, and absorbed light is equal to the incident light. The ratio between transmitted light and incident light is referred to as "transmittance". This transmittance is also called light transmittance. The ratio between absorbed light and incident light is referred to as "absorbance". Absorbance is obtained by subtracting the amount of reflected light and the amount of transmitted light from the amount of incident light and further dividing by the amount of incident light. FIG. 5 depicts the relationship between light transmittance and the wavelength of light in each filter.

Figure 6:
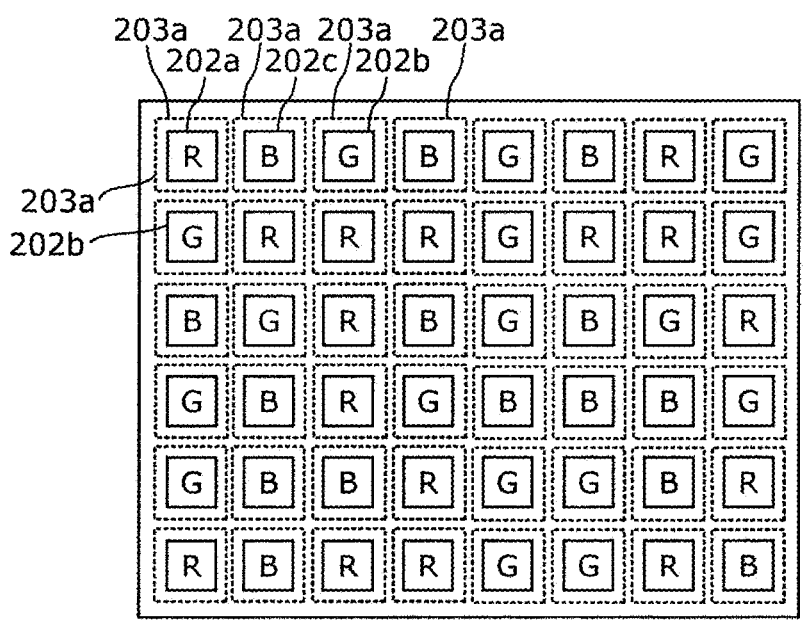
FIG. 6 is a schematic drawing depicting an arrangement on a two-dimensional plane of the random color filter array constituted of the three types of filters and the imaging sensor.
Figure 7A:
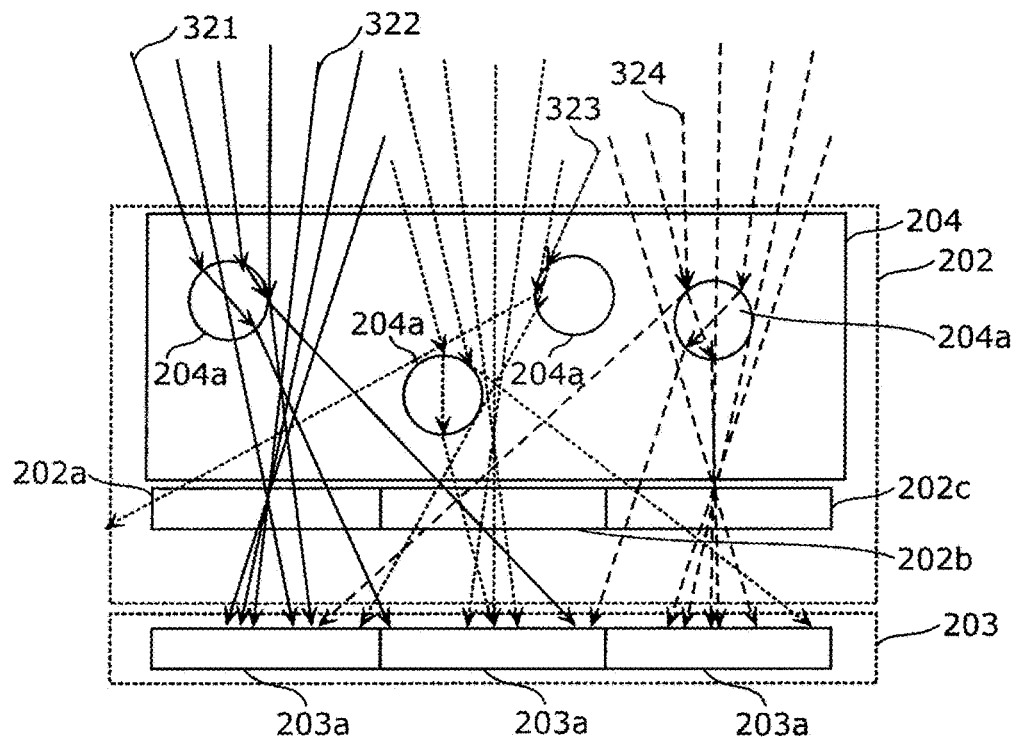
FIG. 7A is a schematic drawing depicting a cross section of the random color filter array constituted of the three types of filters and the imaging sensor.

FIGS. 6 and 7A are schematic drawings of the random color filter array 202 constituted of the three types of color filters 202a to 202c. FIG. 6 depicts the arrangement on a two-dimensional plane of the color filters of the random color filter array 202 and the photodiodes 203a of the imaging sensor 203. This two-dimensional plane is a plane that is parallel to the light-receiving surface of the imaging sensor 203, for example. FIG. 6 depicts an example in which the color filters 202a, 202b, and 202c are represented by R, G, and B, respectively, and the color filters 202a to 202c are arranged randomly. A random arrangement may be created using a random number sequence, or a non-repeating pattern may be prepared in advance for use in creating a random arrangement. FIG. 7A depicts a cross section of the random color filter array 202 and the imaging sensor 203.

The scattering unit 204 has a substance (for example, a resin, glass, or the like) having a first refractive index, and a substance (for example, an oxide or the like) having a second refractive index that is different from the first refractive index.

As a more specific example, the scattering unit 204 has a resin layer and a plurality of particles 204a located inside the resin layer. The resin that constitutes the resin layer has a first refractive index, for example, and the substance that constitutes the particles has a second refractive index, for example. The difference between the second refractive index and the first refractive index may be 0.4 or more, for example. A material for the resin may be a material having a refractive index that is different from the second refractive index. For example, a material for the resin may be at least one resin selected from the group consisting of an acrylate resin, an epoxy resin, and a methacrylate resin. A material for the particles located inside the resin layer may be a material having a refractive index that is different from the first refractive index, and may be at least one selected from the group consisting of $TiO_2$, $SiN$, $ZrO_2$, $ZnO$, and $Ta_2O_5$, for example. The second refractive index is 1.9 or more, for example. Furthermore, the particle size (that is, the average particle size) of the particles is 500 nm or more and 1000 nm or less, for example. It should be noted that, in order to cause light of the visible light band to scatter by means of refraction, it is necessary to have a size that is equivalent to the wavelength of visible light, and it is therefore useful for the particle size to be 500 nm or more and 1000 nm or less. It should be noted that the average particle size is measured using laser diffraction and a scattering method. Specifically, laser light is radiated onto a material and the intensity distribution of diffraction and scattered light from the material are measured. The average particle size is obtained using the intensity distribution of diffraction or scattered light. More specifically, measurement is carried out by calculating the average particle size from a particle size distribution specified by JIS (Japanese Industrial Standards) 8819-2. In the scattering unit 204, the plurality of particles 204a scatter within the resin layer in a random arrangement, for example. A random arrangement does not refer to particles of a uniform particle size being arranged with uniform spaces therebetween, but refers to the plurality of particles 204a being arranged in such a way that the particle sizes of the plurality of particles 204a are different and/or the spaces between the plurality of particles 204a are not uniform. A random arrangement of the plurality of particles 204a within the resin layer may be realized by particles having particle sizes that are set in advance in such a way as to be random being arranged in random positions. A random arrangement of the plurality of particles 204a within the resin layer may be realized by particles having different particle sizes being arranged at different densities for each location. Furthermore, a random arrangement of the plurality of particles 204a within the resin layer can be realized also using a plurality of the particles 204a which have been coated with substances having different refractive indexes. In addition, a random arrangement of the plurality of particles 204a within the resin layer can be realized also using a plurality of the particles 204a for which a process to make the particle sizes uniform has not been specially carried out.

As depicted in FIG. 7A, the three types of color filters 202a to 202c are arranged spaced apart from the imaging sensor 203, and light transmitted through the image forming optical system 201 is scattered by the scattering unit 204, transmitted through the three types of color filters 202a to 202c, and received by the plurality of photodiodes 203a. Due to the scattering of light by the scattering unit 204, light transmitted through one color filter can be received by a plurality of the photodiodes 203a, and light transmitted through a plurality of color filters can be received by one of the photodiodes 203a.

Figure 8:
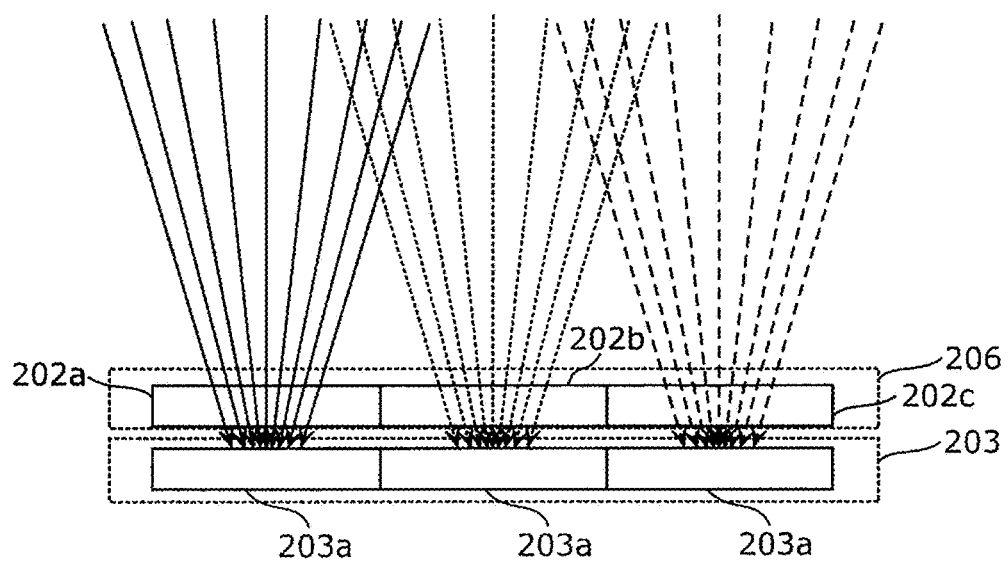
FIG. 8 is a schematic drawing of a color filter array in a conventional color imaging device.

FIG. 8 is a schematic drawing of a color filter array 206 of a Bayer array in a conventional color imaging device. Compared with the random color filter array 202 according to the present embodiment (see FIG. 7A), the conventional color filter array 206 does not have the scattering unit 204. Furthermore, in the conventional color filter array 206, in order to prevent crosstalk between color filters, the color filters (color filters 202a and the like) that make up the color filter array 206 and the imaging sensor 203 are near to each other. Light transmitted through one color filter by means of an image forming optical system is collected in a light-receivable region of one photodiode in the imaging sensor 203. That is, in FIG. 8, the light indicated by the solid lines is generally transmitted through only the color filter 202a in one arrangement position, and is received in the imaging sensor 203 by only one photodiode 203a in the arrangement position (namely the arrangement position at the left end in FIG. 8) corresponding to the arrangement position of that color filter 202a (namely the arrangement position at the left end in FIG. 8). Similarly, the light indicated by the dotted lines is generally transmitted through only the color filter 202b in one arrangement position (namely the arrangement position in the center in FIG. 8) and is received by only one photodiode 203a in the corresponding arrangement position (namely the arrangement position in the center in FIG. 8), and the light indicated by the dashed lines is generally transmitted through only the color filter 202a in one arrangement position (namely the arrangement position at the right end in FIG. 8) and is received by only one photodiode 203a in the corresponding arrangement position (namely the arrangement position at the right end in FIG. 8).

In the random color filter array 202 according to the present embodiment depicted in FIG. 7A, for example, similar to the example of light indicated by the solid line in FIG. 8, light 322 indicated by a solid line is transmitted through the color filter 202a in the arrangement position at the left end in FIG. 7A and is received by the photodiode 203a in the arrangement position at the left end in FIG. 7A; however, light 321 indicated by a solid line is scattered due to refraction in the scattering unit 204 including the particles 204a or the like, is transmitted through the color filter 202a in the arrangement position at the left end in FIG. 7A, and is received by the photodiode 203a in the arrangement position in the center in FIG. 7A, which is different from the example of light indicated by the solid line in FIG. 8.

Furthermore, in FIG. 7A, light 323 indicated by a dotted line is scattered due to refraction in the scattering unit 204 including the particles 204a or the like, is transmitted through the color filter 202b in the arrangement position in the center in FIG. 7A, and is received by the photodiode 203a in the arrangement position at the left end in FIG. 7A, which is different from the example of light indicated by the dotted line in FIG. 8.

Furthermore, in FIG. 7A, light 324 indicated by a dashed line is scattered due to refraction in the scattering unit 204 including the particles 204a or the like, is transmitted through the color filter 202b in the arrangement position in the center in FIG. 7A, which is different from the example of light indicated by the dashed line in FIG. 8, and is received by the photodiode 203a in the arrangement position at the left end in FIG. 7A.

In this way, the random color filter array 202 of the present embodiment, as a result of having the scattering unit 204 including the particles 204a or the like, causes light transmitted through color filters in a plurality of different positions to be received by one of the photodiodes 203a, and causes light transmitted through a color filter in the same position to be received by a plurality of the photodiodes 203a. That is, the random color filter array 202 has a light transmittance and point-spread function that differ according to the position and the wavelength of light, and sampling that is random both spatially and in terms of wavelength can therefore be realized.

FIG. 7A depicts an example in which the particles 204a of the scattering unit 204 are arranged between the image forming optical system 201 and the color filters 202a to 202c in the random color filter array 202; however, it should be noted that the particles 204a may be additionally arranged also between the color filters 202a to 202c and the photodiodes 203a, or may be arranged between the color filters 202a to 202c and the photodiodes 203a.

As mentioned above, in the imaging system 10 according to the present embodiment, the random color filter array 202 has the particles 204a, which have a refractive index that is different from that of a solvent (for example, a resin or the like) in the scattering unit 204, between the color filters 202a to 202c and the imaging sensor 203, and therefore has a light transmittance and point-spread function that differ according to the position and the wavelength of light, and a random (that is, enables random sampling) optical filter array is realized. It should be noted that, for example, if any one of the three types of color filters 202a to 202c is randomly selected and arranged in each position making up the two-dimensional array on the two-dimensional plane in the random color filter array 202, as depicted in FIG. 6, the randomness can be improved compared to when not randomly arranged.

Figure 7B:
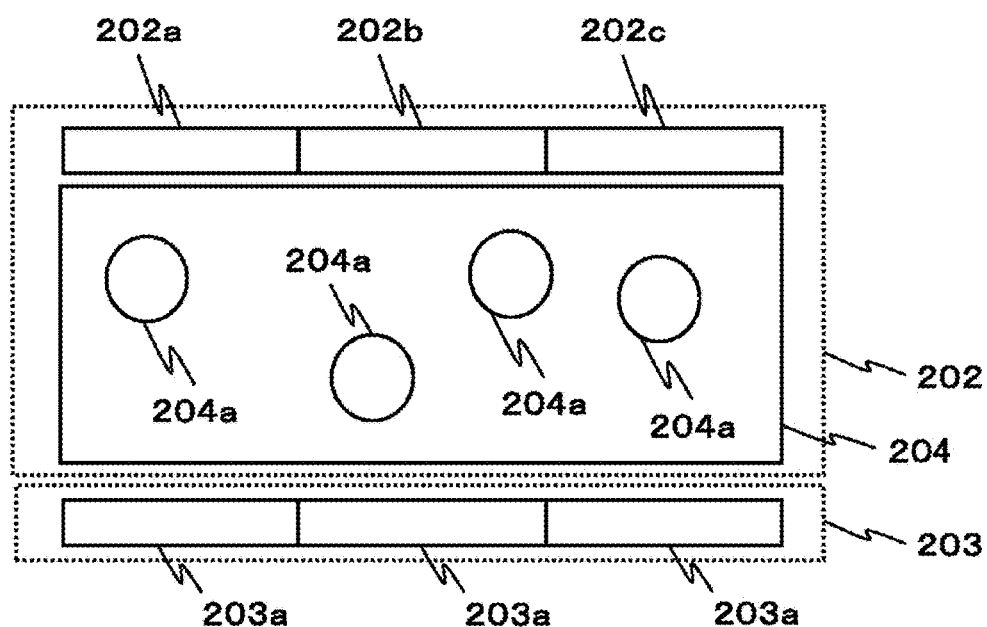
FIG. 7B is a schematic drawing depicting a cross section of the random color filter array constituted of the three types of filters and the imaging sensor.

It should be noted that, as mentioned above, the scattering unit 204 may be arranged to the rear of the color filters 202a to 202c and in front of the imaging sensor 203, in other words, the scattering unit 204 may be arranged between the color filters 202a to 202c and the imaging sensor 203. This example is depicted in FIG. 7B.

In the above description, the filters making up the random color filter array 202 were the three types of color filters 202a to 202c; however, there may be four or more types of filters, and the filters do not necessarily have to be color filters as long as they function as optical filters that have mutually different light transmittances as wavelength characteristics. Hereinafter, a mode in which four types of filters are used will be described as the aforementioned random color filter array 202.

Figure 9:
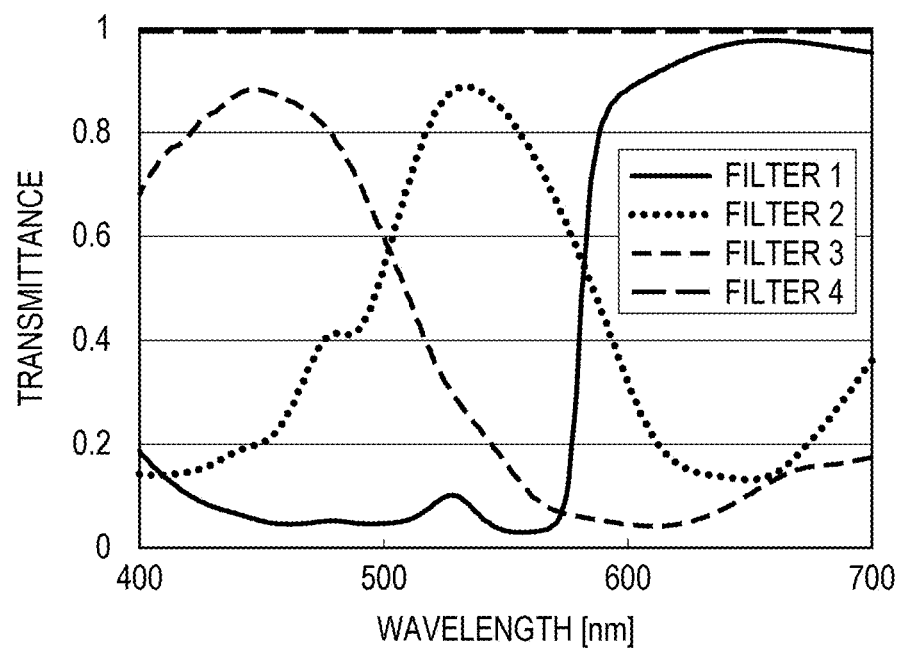
FIG. 9 is a drawing depicting transmittance as a wavelength characteristic of four types of filters according to an embodiment.
Figure 10:
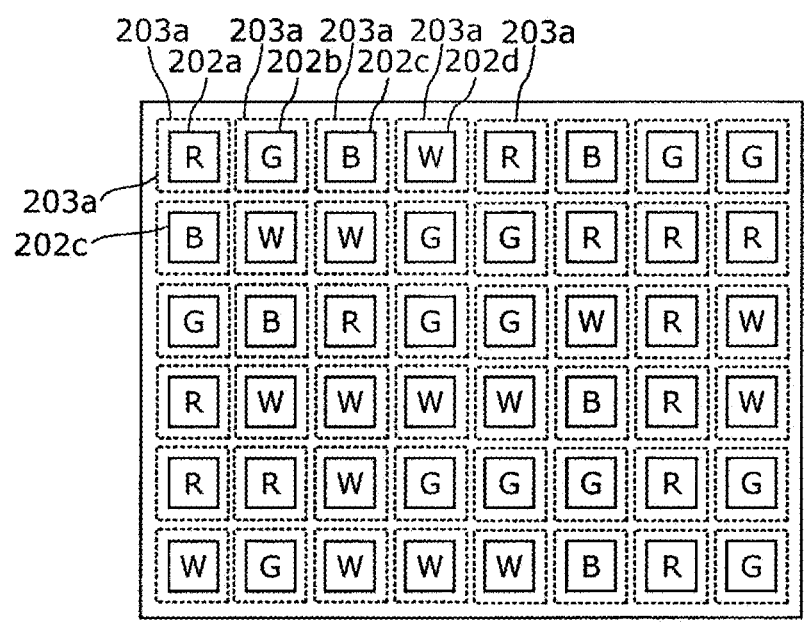
FIG. 10 is a schematic drawing depicting an arrangement on a two-dimensional plane of a random color filter array constituted of the four types of filters and the imaging sensor.

FIG. 9 depicts light transmittance as wavelength characteristics of the four types of filters. Furthermore, FIG. 10 depicts filters of the random color filter array 202 made up of the four types of filters, and the arrangement on a two-dimensional plane of the photodiodes 203a of the imaging sensor 203. In FIG. 9, filters 1 to 3 are the color filters 202a to 202c, and filter 4 is a filter that transmits all regions. In FIG. 10, a color filter 202d serving as this filter 4 is represented by W. Here, this filter that transmits all regions in the random color filter array 202 is called a color filter for convenience. This filter 4 (namely the color filter 202d) can be realized by not adding a member serving as a filter when the random color filter array is generated. By providing a portion in which a member is not added in this way, a filter that transmits all regions is included in the random color filter array 202, and cost can thereby be suppressed. Furthermore, by increasing the types of the filters, the randomness of the random color filter array 202 can be improved. When the randomness of the random color filter array 202 is increased, the image quality of a color image generated by the color image generation circuit 105 improves, as described later on.

In the aforementioned embodiment, the three types of color filters 202a to 202c making up the random color filter array 202 are an R (red) filter, a G (green) filter, and a B (blue) filter, respectively; however, the filter characteristics are not restricted thereto. For example, complementary color filters (for example, magenta, cyan, and yellow filters) having a wide transmission band compared to primary color filters such as an R filter, a G filter, or a B filter may be used in the random color filter array 202.

Figure 11:
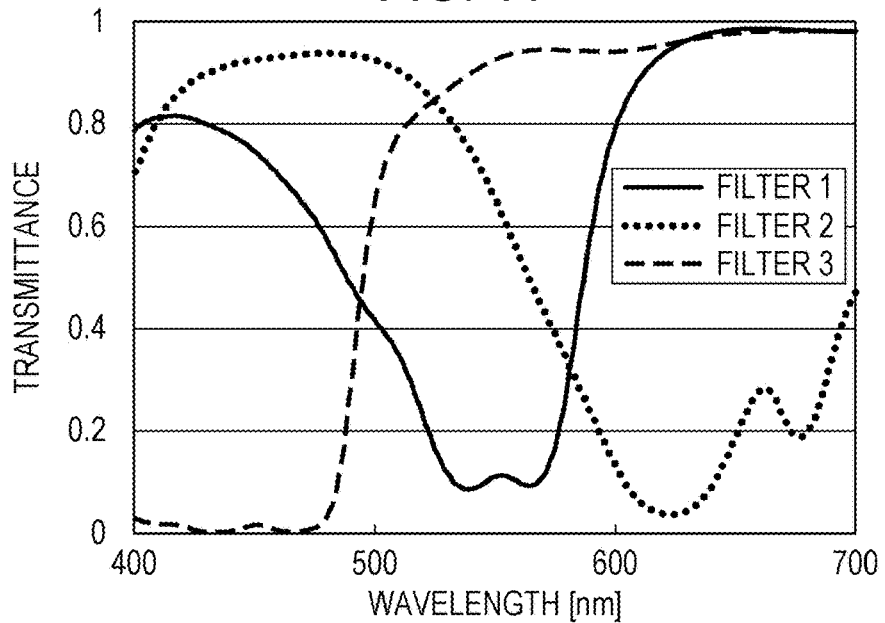
FIG. 11 is a drawing depicting transmittance as a wavelength characteristic of three types of complementary color filters.

FIG. 11 is a drawing depicting light transmittance as wavelength characteristics of three types of complementary color filters. In the same drawing, filter 1 is a magenta filter, for example, filter 2 is a cyan filter, for example, and filter 3 is a yellow filter, for example.

The transmission band widens due to using these types of complementary color filters, and an image having reduced noise can therefore be acquired.

It goes without saying that R, G, and B color filters, namely primary color filters, a filter that transmits all regions of wavelength bands, and complementary color filters may be combined as the filters making up the random color filter array 202. For example, the random color filter array 202 may be configured with the filters depicted in FIGS. 9 and 11 being combined. In this case, the random color filter array 202 has a combination of seven types of filters and the scattering unit 204, and the randomness can therefore be improved.

Similarly, the filters depicted in FIGS. 5 and 11 may be combined, and a random color filter array 202 having a combination of six types of filters and the scattering unit 204 may be configured. In this case, the random color filter array 202 has a combination of six types of filters and the scattering unit 204, and the randomness can therefore be improved.

(Processing of Image Generation Device 12)

Next, processing in the image generation device 12 (see FIG. 1) will be described based on FIG. 12.

Figure 12:
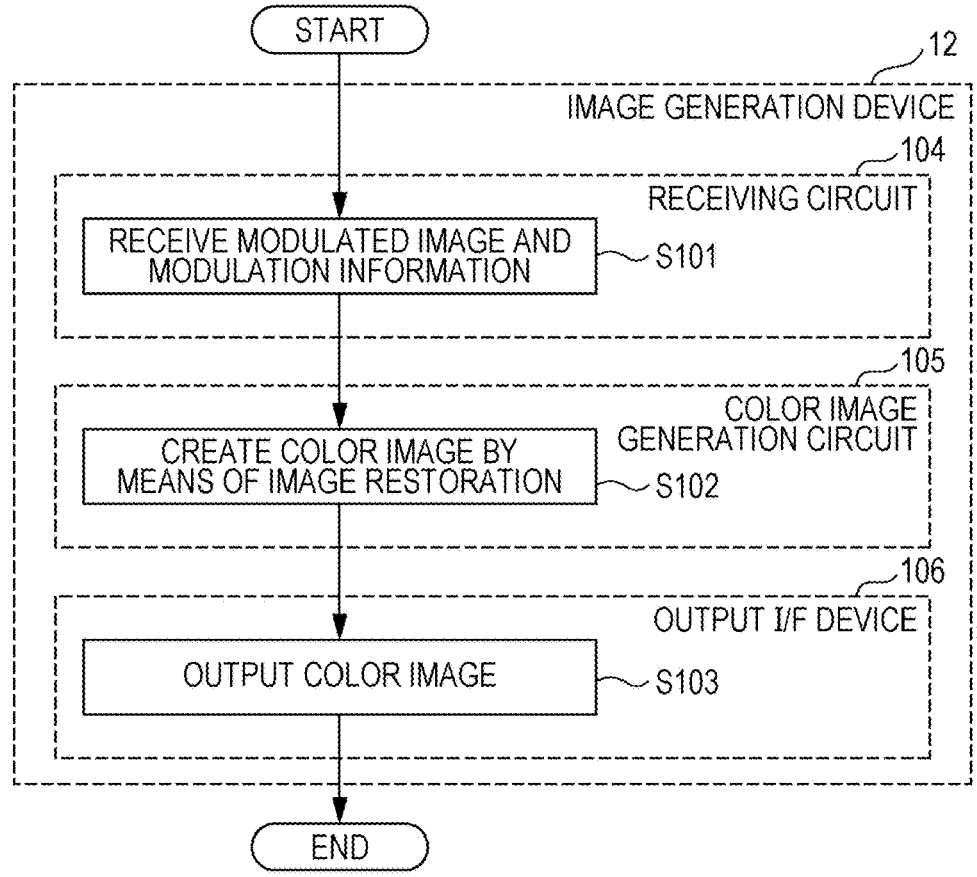
FIG. 12 is a flowchart depicting the main processing procedures of an image generation device in the imaging system according to embodiment 1.

FIG. 12 is a flowchart depicting the main processing procedures of the image generation device 12.

The receiving circuit 104 of the image generation device 12 receives a modulated image and modulation information transmitted by the transmission circuit 103 of the imaging device 11 (step S101).

Next, the color image generation circuit 105 generates a color image, using an image restoration technique (for example, a compressed sensing technique), from the modulated image and the modulation information (step S102).

Next, the output interface device 106 outputs the color image generated by the color image generation circuit 105, to be displayed on a display or used in image processing for detecting humans or the like (step S103).

(Color Image Generation Processing)

Hereinafter, the color image generation processing carried out by the color image generation circuit 105 in step S102 will be described in more detail.

The color image generation processing can be formulated as described below in a case where a captured modulated image is taken as y and a generated image that is a generated color RGB image is taken as x.

$$y=Ax. \quad \text{(equation 1)}$$

Here, matrix A is a sampling matrix that indicates the modulation information. The sampling matrix A indicates a relationship between the modulated image y and the generated image x. For example, in a case where the number of pixels is N, the modulated image y is expressed by a matrix of N rows and one column, the generated image x is expressed by a matrix of 3N rows and one column, and the sampling matrix A is expressed by a matrix of N rows and 3N columns.

Hereinafter, a method for acquiring the sampling matrix A will be described.

The sampling matrix A indicates a light transmittance and point-spread function that differ according to each position and wavelength band. Thus, for example, the sampling matrix A can be acquired by arranging a monitor in such a way as to cover the entire field of view captured by the imaging sensor 203 as an object, and performing imaging while displaying red, green, and blue dot images in sequence on the monitor.

Next, a method for acquiring the generated image x from the sampling matrix A and the modulated image y in the color image generation circuit 105 will be described. In order to simplify the description, a case where the number of pixels of the imaging sensor 203 is N=16 will be described.

FIGS. 13A to 13D are schematic drawings depicting the modulated image y for a case where the number of pixels of the imaging sensor 203 is N=16, and an R image r, a G image g, and a B image b for the generated image x (color RGB image) which is generated based on this modulated image y. FIG. 13A depicts the modulated image y, FIG. 13B depicts the R image r constituting the red (R) channel of the color RGB image generated based on the modulated image y, FIG. 13C depicts the G image g constituting the green (G) channel of the color RGB image generated based on the modulated image y, and FIG. 13D depicts the B image b constituting the blue (B) channel of the color RGB image generated based on the modulated image y. The modulated image y and the generated image x are represented by the following equations.

$$y = [y_1\ y_2\ y_3\ \ldots\ y_{16}]^T.$$

$$x = [r_1\ g_1\ b_1\ r_2\ g_2\ b_2\ r_3\ g_3\ b_3\ \ldots\ r_{16}\ g_{16}\ b_{16}]^T. \quad \text{(equation 2)}$$

As is clear from equation 2, in equation 1, there are 48 elements for x which is an unknown variable, and there are 16 elements for y which is an observed variable. That is, there are few equations for unknown variables. Therefore, equation 1 constitutes an ill-posed problem.

The imaging system 10 uses a compressed sensing technique in order to solve this ill-posed problem. The compressed sensing technique is a technique in which an amount of data is compressed by carrying out addition processing (encoding) when sensing a signal, and the original signal is decoded (restored) by carrying out restoration processing using the compressed data. In compressed sensing processing, prior knowledge is used in order to solve ill-posed problems.

Total variation which is an absolute value sum for luminance changes among nearby positions in an image may be used as prior knowledge for natural images (for example, Rudin L. I., Osher S. J., and Fatemi E., "Nonlinear Total Variation Based Noise Removal Algorithms", Physica D, vol. 60, pp. 259-268, 1992, and Shunsuke Ono, Isao Yamada, "Decorrelated Vectorial Total Variation", IEEE Conference on Computer Vision and Pattern Recognition, 2014). Furthermore, sparsity in which many coefficients become zero in linear transforms such as wavelet transforms, DCT transforms, and curvelet transforms may be used (for example, J. Ma, "Improved Iterative Curvelet Thresholding for Compressed Sensing and Measurement", IEEE Transactions on Instrumentation & Measurement, vol. 60, no. 1, pp. 126-136, 2011). Furthermore, dictionary learning in which transform coefficients for the aforementioned linear transforms are acquired by learning may be used (for example, M. Aharon, M. Elad, and A. M. Bruckstein, "K-SVD: An Algorithm for Designing Overcomplete Dictionaries for Sparse Representation", IEEE Transactions on Image Processing, vol. 54, no. 11, pp. 4311-4322, 2006).

Here, decorrelated vectorial total variation, which is a method classified as a form of total variation, will be described. This method suppresses the generation of artifacts referred to as false color by calculating gradients for a luminance component and a chrominance component of a color image in a separated manner. This is realized by minimizing the following evaluation function.

$$\arg\min_{x \in [0,255]^{3 \times N}} J(x) + \|Ax - y\|_2^2 \quad \text{(equation 3)}$$

This evaluation function is made up of the following three terms.

1. Data fidelity term: $\|Ax-y\|_2^2$: constraint term for satisfying equation 1
2. Dynamic range term: range ($[0, 255]^{3 \times N}$) of x for calculating minimum value min: constraint term for the pixel value to be 0 or more and 255 or less
3. Decorrelated vectorial total variation term: J(x): total variation term with which gradients for the luminance component and the chrominance component of a color image are separated Here, $\|Ax-y\|_2^2$ indicates the square sum of Ax-y (the square of the L2 norm). Furthermore, J(x) corresponds to a difference among nearby pixels relating to the luminance component and the chrominance component in an entire image, and is expressed by the following equations 4 to 8. It should be noted that, in the following equations 4 to 8, R indicates a real number and $R_+$ indicates a non-negative real number.

$$J: R^{3N} \to R_+ : x \mapsto \|DCx\|_{1,2}^{(w,2,4)} \quad \text{(equation 4)}$$

$$x = [\,x_R^T\ x_G^T\ x_B^T\,]^T \in R^{3N} \quad \text{(equation 5)}$$

$$C: R^{3N} \to R^{3N} : x \mapsto [\,x_1\ x_2\ x_3\,]$$
(orthogonal color transform)

$$x_1 = \frac{1}{\sqrt{3}}(x_R + x_G + x_B), \quad \text{(equation 6)}$$

$$x_2 = \frac{1}{\sqrt{2}}(x_R - x_B),$$

$$x_3 = \frac{1}{\sqrt{6}}(x_R - 2x_G + x_B)$$

$$D = \mathrm{diag}(\,D_1\ D_1\ D_1\,) \in R^{6N \times 3N}$$
(primary gradient operator in color image)

$$D_1 = [\,D_v^T\ D_h^T\,]^T \in R^{2N \times N}$$
(primary gradient boundary condition operator of each channel)

$$D_v, D_h \in R^{N \times N} \quad \text{(equation 7)}$$
(vertical/horizontal primary gradient operator)
(Neumann boundary)

$$\|\cdot\|_{1,2}^{(w,k_1,k_2)} : R^{(k_1+k_2)N} \to R_+ : x \mapsto w\|x_1\|_{1,2}^{(k_1)} + \|x_2\|_{1,2}^{(k_2)} \quad \text{(equation 8)}$$

$$x = [\,x_1^T\ x_2^T\,]^T,\ x_1 \in R^{k_1 N},\ x_2 \in R^{k_2 N}$$

$$w \in (0, 1)$$

$$\|\cdot\|_{1,2}^{(k_2)} : R^{kN} \to R_+ : x \mapsto = \sum_{i=1}^{N} \sqrt{\sum_{j=0}^{k-1} x_{i+jN}^2}$$

($m_i$ is the $i^{th}$ element of x)

Figure 14A:
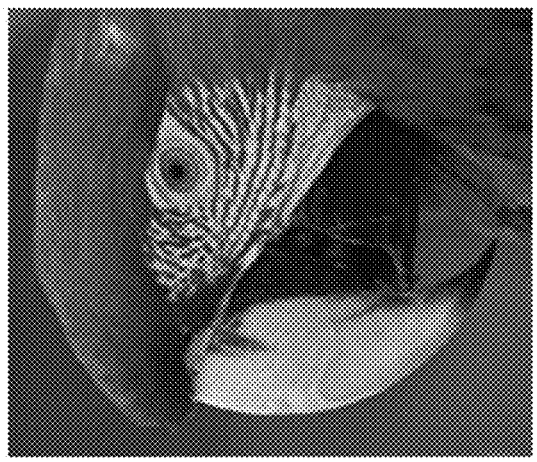
FIGS. 14A to 14C are drawings depicting an example of an image based on a color image generated by a color image generation circuit or the like in embodiment 1.
Figure 14B:
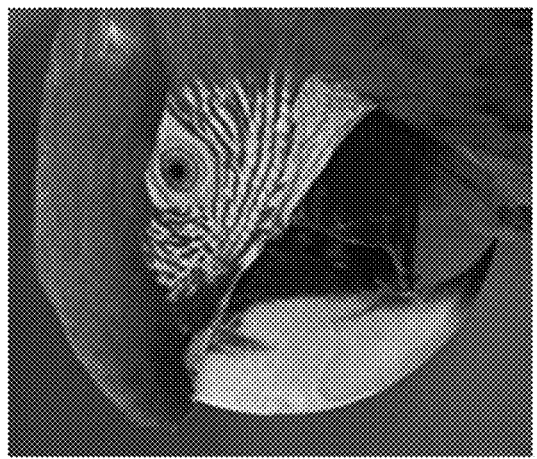
Figure 14C:
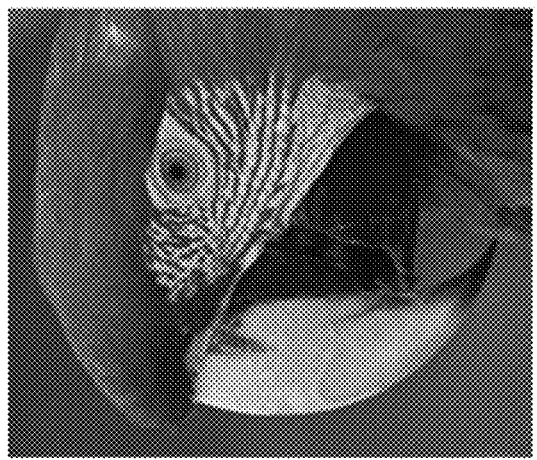

FIGS. 14A to 14C depict an example of an image based on a color image generated by the color image generation circuit 105 in the present embodiment. FIG. 14A depicts an image based on a correct image (correct color image) captured by a three-plate camera. FIG. 14B depicts an image based on a demosaicing image produced by the ACPI (adaptive color plane interpolation) method described in the specification of U.S. Pat. No. 5,629,734, which is a general demosaicing method. FIG. 14C depicts an image based on a generated color image (restored image) generated using decorrelated vectorial total variation by the color image generation circuit 105 in the present embodiment. The inventors of the present application actually generated and compared color images; however, in FIGS. 14A to 14C, each image is depicted by means of shades corresponding to the luminance values (that is, luminance values calculated by multiplying by a coefficient for each color and adding component values for R, G, and B) of that image. Furthermore, FIGS. 14B and 14C also indicate a PSNR (peak signal-to-noise ratio) for the color images thereof.

As depicted in FIGS. 14A to 14C, a generated color image (restored image) of the present embodiment has a PSNR that is an improvement of 1 dB or more compared to the color image produced by the ACPI method, and can be said to be the closest to the correct image.

Furthermore, with compressed sensing, it is known that the image quality of the restored image improves as the randomness of the sampling matrix A increases. The random color filter array 202 of the present embodiment increases the randomness of the sampling matrix A due to having the scattering unit 204, and the image quality of the restored image can thereby be improved.

According to the imaging system 10 which carries out imaging using the aforementioned random color filter array 202, a high-definition color image having reduced artifacts can be acquired by carrying out color image generation processing by means of the compressed sensing technique.

Embodiment 2

Figure 15:
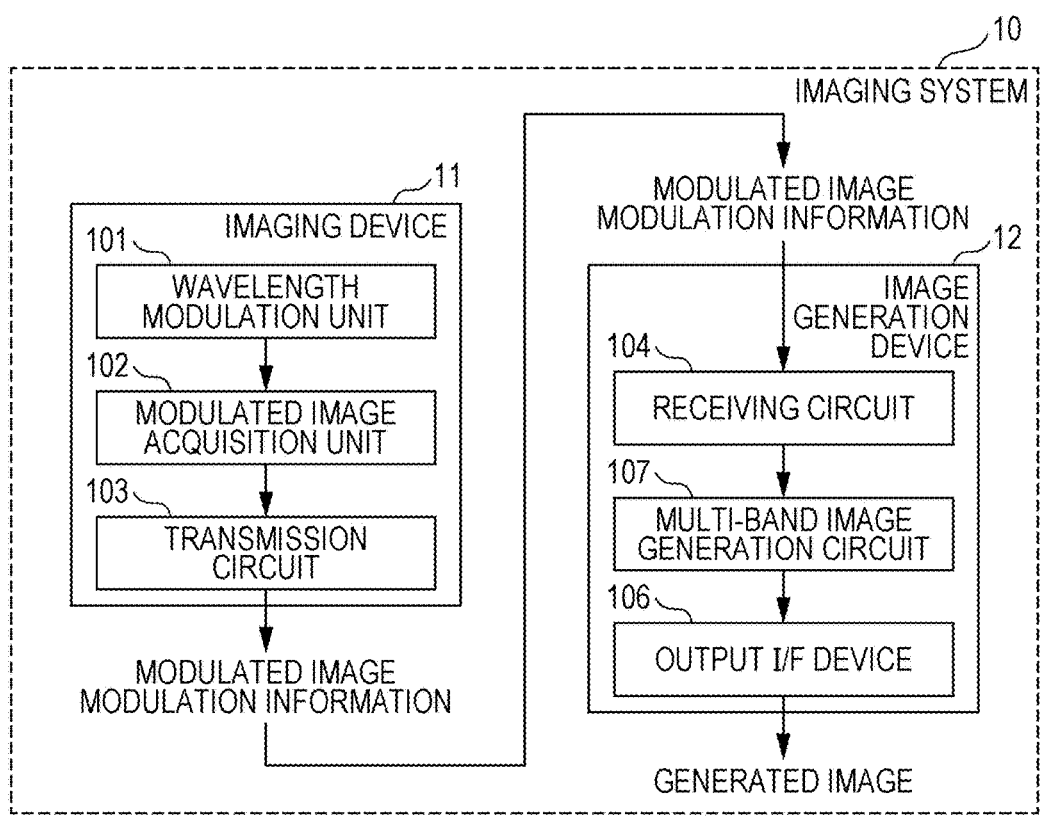
FIG. 15 is a schematic drawing depicting a configuration of an imaging system according to embodiment 2.

FIG. 15 depicts a configuration of the imaging system 10 according to the present embodiment. From among the constituent elements of the imaging system 10 according to the present embodiment, constituent elements that are the same as those of the imaging system 10 given in embodiment 1 are denoted in FIG. 15 by the same reference numbers as in FIG. 1, and descriptions thereof are omitted here as appropriate. The imaging system 10 according to the present embodiment is provided with a multi-band image generation circuit 107, instead of the color image generation circuit 105 given in embodiment 1, in the image generation device 12. This imaging system 10 can generate a multi-band image that is not restricted to an RGB color image of the three primary colors. A multi-band image is an image expressed by a signal in which the wavelength bands of light are divided into four or more regions. Those wavelength bands are not restricted to visible light and may be wavelength bands such as near-infrared, infrared, and ultraviolet, and a multi-band image can be, for example, a near-infrared light image, an infrared light image, an ultraviolet light image, or the like.

The multi-band image generation circuit 107 generates a multi-band image, using an image restoration technique (for example, the compressed sensing technique), from a modulated image and modulation information. The multi-band image generation circuit 107 sends the generated multi-band image to the output interface device 106.

The output interface device 106 according to the present embodiment outputs the multi-band image to outside of the image generation device 12 as a digital signal or as an analog signal. The output interface device 106 may switch the output image in such a way as to output a visible light color image in a bright scene and to output a near-infrared light image in a dark scene.

Furthermore, the random color filter array 202 in the wavelength modulation unit 101 (see FIG. 15) of the imaging system 10 according to the present embodiment may be a random optical filter array configured as an arrangement of a plurality of types of optical filters including, for example, a filter that primarily transmits near-infrared light or the like as well as color filters such as an R filter, a G filter, and a B filter. For example, in a case where a near-infrared light image is to be acquired as a multi-band image, a filter that transmits near-infrared light can be included in the random optical filter array.

Hereinafter, processing in the image generation device 12 (see FIG. 15) according to the present embodiment will be described based on FIG. 16.

Figure 16:
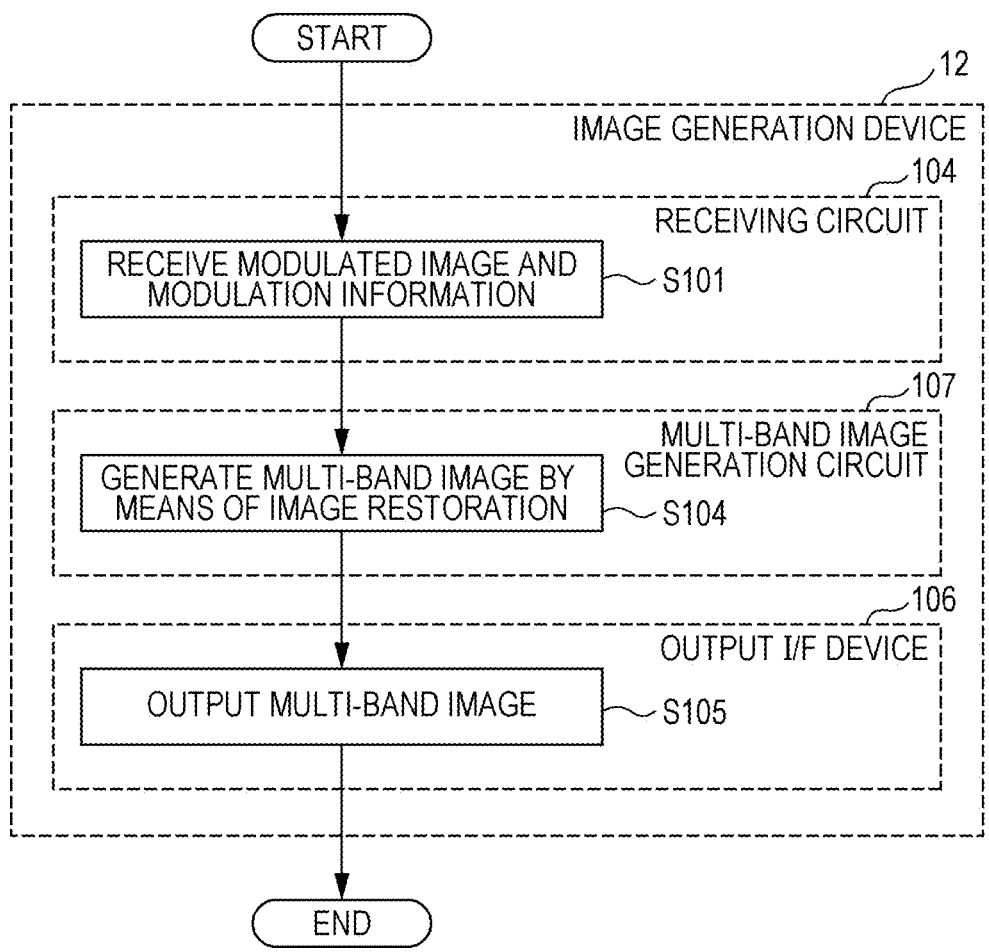
FIG. 16 is a flowchart depicting the main processing procedures of an image generation device in the imaging system according to embodiment 2.

FIG. 16 is a flowchart depicting the main processing procedures of the image generation device 12 in the present embodiment. In FIG. 16, elements that are the same as in FIG. 12 are denoted by the same reference numbers.

The receiving circuit 104 of the image generation device 12 receives a modulated image and modulation information transmitted by the transmission circuit 103 (step S101).

Next, the multi-band image generation circuit 107 carries out multi-band image generation processing that generates a multi-band image, using an image restoration technique (for example, the compressed sensing technique), from a modulated image and modulation information (step S104).

Next, the output interface device 106 outputs the multi-band image generated by the multi-band image generation circuit 107, to be displayed on a display or used in image processing for detecting humans or the like (step S105).

(Multi-Band Image Generation Processing)

Hereinafter, the multi-band image generation processing carried out in step S104 will be described in more detail.

The multi-band image generation processing can be formulated as described below in a case where a captured modulated image is taken as y' and a generated M-band multi-band image is taken as x' (M being an integer of 4 or more).

$$y'=Ax'. \quad \text{(equation 9)}$$

Here, matrix A is a sampling matrix that indicates the modulation information.

Figure 17:
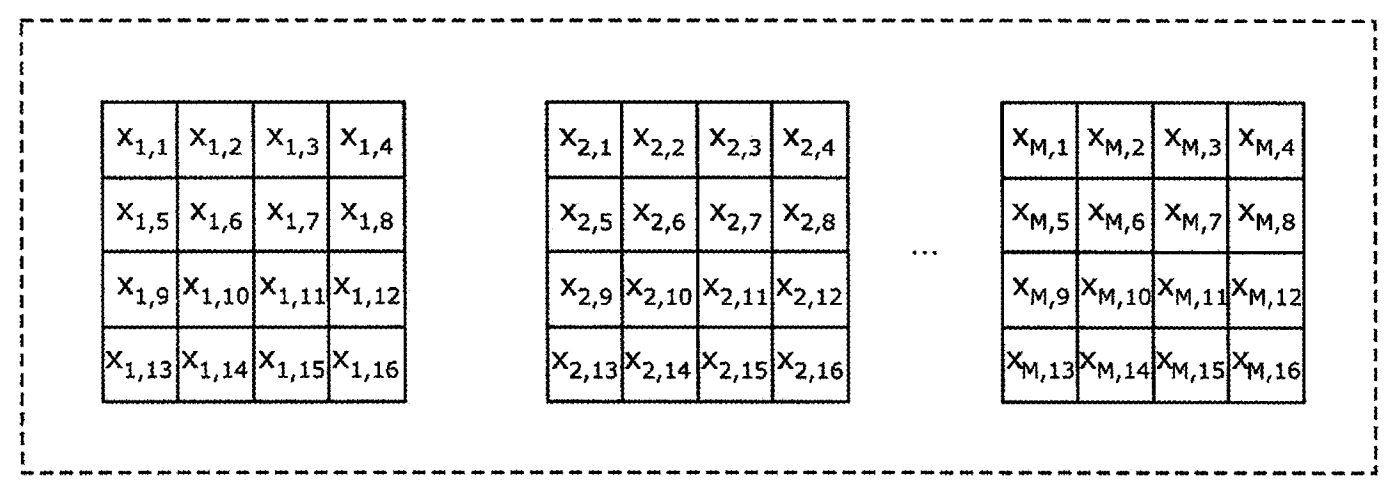

In order to simplify the description, if it is assumed that the number of pixels of the imaging sensor 203 is N=16 (see FIGS. 13A to 13D), the modulated image y' and the generated image x', which is a multi-band image generated based on the modulated image y', are represented by the following equations. The generated image x' is as depicted in FIG. 17 if represented divided into images for each of the M channels.

$$y'=[y_1\ y_2\ y_3\ \ldots\ y_{16}]^T.$$

$$x'=[r_{1,1}\ x_{2,1}\ x_{3,1}\ \ldots\ x_{M,1}\ x_{1,2}\ x_{2,2}\ x_{3,2}\ \ldots\ x_{M,2}\ \ldots\\ x_{1,16}\ x_{2,16}\ x_{3,16}\ \ldots\ x_{M,16}]^T. \quad \text{(equation 2)}$$

As is clear from equation 10, in equation 9, there are 16M elements for x' which is an unknown variable, and there are 16 elements for y' which is an observed variable. That is, there are few equations for unknown variables. Therefore, equation 9 constitutes an ill-posed problem. However, as indicated in embodiment 1, this ill-posed problem can be solved by using the compressed sensing technique. The various types of techniques given in embodiment 1 can be applied also for the imaging system 10 that generates a multi-band image by means of imaging of the present embodiment.

As mentioned above, the imaging system 10 of the present embodiment carries out imaging using the random color filter array 202 or a random optical filter array, and carries out multi-band image generation processing by means of the compressed sensing technique, and can thereby reduce artifacts and acquire a high-definition multi-band image.

OTHER EMBODIMENTS

As mentioned above, embodiments 1 and 2 have been described as exemplifications of the technique according to the present disclosure. However, the technique according to the present disclosure is not restricted to these embodiments, and can also be applied to an embodiment in which an alteration, substitution, addition, omission or the like has been carried out as appropriate. In other words, modes in which various types of modifications conceived by a person skilled in the art have been implemented in the aforementioned embodiments, modes constructed by combining the constituent elements in mutually different embodiments, and the like are also included within an embodiment of the technique according to the present disclosure provided they do not depart from the purpose of the present disclosure. For example, modified examples such as the following are also included within an embodiment of the technique according to the present disclosure.

In the aforementioned embodiments, an example was given in which the imaging system 10 is provided with the imaging device 11 and the image generation device 12; however, the image generation device according to the present disclosure may contain the aforementioned imaging device 11, that is, may be configured of the aforementioned imaging system 10.

In the aforementioned embodiments, the imaging system 10 that generates a color image or a multi-band image was described; however, the imaging system 10 may generate an image expressed by a signal in which an arbitrary wavelength band of light is divided into two or more regions, and, for example, the imaging system 10 may generate an image expressed by a signal in which the infrared light region is divided into three regions.

Furthermore, the aforementioned image forming optical system 201 is not restricted to using a lens for image forming, and, for example, may use a reflective mirror or the like.

Furthermore, the size on a two-dimensional plane parallel to the light-receiving surface of the imaging sensor 203, of each optical filter included in the random color filter array 202 or the random optical filter array including the scattering unit 204 given in the aforementioned embodiments may be smaller than the size of the photodiodes 203a in the imaging sensor 203. In addition, for example, each of a plurality of optical filters (for example, six filters or the like) randomly selected from a plurality of types of optical filters (for example, the three types of the color filters 202a to 202c) may be arranged in such a way as to overlap one of the photodiodes 203a in mutually different positions.

Furthermore, in the aforementioned embodiments, an example of the scattering unit 204 was described as the scattering unit 204 which has: a resin layer constituted of a resin having a first refractive index; and the plurality of particles 204a located inside the resin layer and constituted of a substance having a second refractive index. However, this is merely an example, and the scattering unit 204 may randomly scatter light in accordance with the location thereof on a two-dimensional plane of a random optical filter array having a substantially planar shape (for example, the random color filter array 202), and, for example, may include a structure formed by stacking a first layer constituted of a material having a first refractive index, and a second layer constituted of a material having a second refractive index that is different from the first refractive index.

Furthermore, the scattering unit 204 described in the aforementioned embodiments was located between the plurality of types of optical filters and the photodiodes 203a, or in front of the plurality of types of optical filters; however, for example, the scattering unit 204 may be arranged in such a way as to be located between the plurality of types of optical filters and the photodiodes 203a and in front of the plurality of types of optical filters, that is, in such a way as to contain the plurality of types of optical filters.

Furthermore, the constituent elements (particularly the circuits and the like) of the imaging system 10 described in the aforementioned embodiments may be configured of dedicated hardware, or may be realized by executing software (a program) suitable for the constituent elements. The constituent elements may be realized by a program execution unit such as a microprocessor reading out and executing a program recorded in a storage medium (or a recording medium) such as a hard disk or a semiconductor memory.

Furthermore, the plurality of circuits included in the imaging device 11 may constitute one circuit in their entirety or may each constitute separate circuits. Similarly, the plurality of circuits included in the image generation device 12 may constitute one circuit in their entirety or may each constitute separate circuits. Furthermore, these circuits may each be a general-purpose circuit or may be a dedicated circuit. Furthermore, for example, processing executed by a specific constituent element in the aforementioned embodiments may be executed by another constituent element instead of the specific constituent element. Furthermore, the order in which the various types of processing in the aforementioned embodiments is executed may be altered, and a plurality of processing may be executed in parallel.

An image generation device according to the present disclosure as described above is provided with: a random optical filter array (for example, the random color filter array 202) that has a plurality of types of optical filters (for example, the color filters 202a to 202d, a filter that primarily transmits light other than visible light, or the like) and the scattering unit 204; the photodiodes 203a that receive light transmitted through the random optical filter array; the AD conversion unit 203b that converts the light received by the photodiodes 203a, into digital data; and a generation circuit (for example, the color image generation circuit 105, the multi-band image generation circuit 107, or the like) that generates an image, using the digital data and modulation information of the random optical filter array, in which the scattering unit 204 is located between the plurality of types of optical filters and the photodiodes 203a, or in front of the plurality of types of optical filters (for example, on an optical path along which light transmitted through the image forming optical system 201 reaches the optical filters), and in which the scattering unit 204 includes a material having a first refractive index, and a material having a second refractive index that is different from the first refractive index. Thus, the photodiodes 203a, which serve as pixels, receive light transmitted through several of the plurality of types of optical filters that have mutually different wavelength characteristics pertaining to the relationship between wavelength and transmittance due to the scattering of light by the scattering unit 204, and the photodiodes 203a are able to acquire sufficient information; therefore, a decline in resolution can be suppressed and an appropriate image can be generated.

Furthermore, for example, the optical filters may be the color filters 202a to 202c, the random optical filter array may be the random color filter array 202, and the generation circuit may be the color image generation circuit 105.

Furthermore, for example, the scattering unit 204 may have a first layer (for example, the resin layer) constituted of the material having the first refractive index, and the particles 204a, which include the material having the second refractive index, scattered in the first layer.

Furthermore, for example, the second refractive index may be 1.9 or more.

Furthermore, for example, the particles 204a may be constituted of SiN, $TiO_2$, $ZrO_2$, ZnO, or $Ta_2O_5$.

Furthermore, for example, the particle size of the particles 204a may be 500 nm or more and 1000 nm or less.

Furthermore, for example, the scattering unit 204 may include a first layer constituted of the material having the first refractive index, and a second layer constituted of the material having the second refractive index, and the first layer and the second layer may be stacked in the thickness direction (that is, the direction orthogonal to the plane) of the random optical filter array having a substantially planar shape.

Furthermore, for example, the generation circuit may be the multi-band image generation circuit 107.

Furthermore, for example, the generation circuit (for example, the color image generation circuit 105, the multi-band image generation circuit 107, or the like) may generate the image, using a compressed sensing technique.

Furthermore, an imaging device according to the present disclosure is provided with: a random optical filter array (for example, the random color filter array 202) that has a plurality of types of optical filters (for example, the color filters 202a to 202d or the like) and the scattering unit 204; the photodiodes 203a that receive light transmitted through the random optical filter array; and the AD conversion unit 203b that converts the light received by the photodiodes 203a, into digital data, in which the scattering unit 204 is located between the plurality of types of optical filters and the photodiodes 203a, or in front of the plurality of types of optical filters, and in which the scattering unit 204 includes a material having a first refractive index, and a material having a second refractive index that is different from the first refractive index. Thus, light can be received having been transmitted through several of the plurality of types of optical filters that have mutually different wavelength characteristics pertaining to the relationship between wavelength and transmittance due to the scattering of light by the scattering unit 204, and therefore the photodiodes 203a, which serve as pixels, are able to acquire sufficient information.

The imaging system according to the present disclosure can be applied to various types of cameras.

What is claimed is:

1. An image generation device comprising:
a random optical filter array that has a plurality of types of optical filters and a scatterer;
photodiodes that receive light transmitted through the random optical filter array;
an AD converter that converts the light received by the photodiodes, into digital data; and
a generation circuit that generates an image, using the digital data and modulation information of the random optical filter array,
wherein the scatterer is located between the plurality of types of optical filters and the photodiodes, and
wherein the scatterer includes a material having a first refractive index, and a material having a second refractive index that is different from the first refractive index.

2. The image generation device according to claim 1,
wherein the optical filters are color filters,
wherein the random optical filter array is a random color filter array, and
wherein the image generated by the generation circuit is a color image.

3. The image generation device according to claim 1,
wherein the scatterer has a first layer constituted of the material having the first refractive index, and particles, which include the material having the second refractive index, scattered in the first layer.

4. The image generation device according to claim 3,
wherein the second refractive index is 1.9 or more.

5. The image generation device according to claim 3,
wherein the particles are constituted of SiN, $TiO_2$, $ZrO_2$, ZnO, or $Ta_2O_5$.

6. The image generation device according to claim 3,
wherein a particle size of the particles is 500 nm or more and 1000 nm or less.

7. The image generation device according to claim 1,
wherein the scatterer includes a first layer constituted of the material having the first refractive index, and a second layer constituted of the material having the second refractive index, and
wherein the first layer and the second layer are stacked in a thickness direction of the random optical filter array.

8. The image generation device according to claim 1,
wherein the image generated by the generation circuit is a multi-band image.

9. The image generation device according to claim 1,
wherein the generation circuit generates the image, using a compressed sensing technique.

10. An imaging device comprising:
a random optical filter array that has a plurality of types of optical filters and a scatterer;
a plurality of photodiodes that receive light transmitted through the random optical filter array; and
an AD converter that converts the light received by each of the plurality of photodiodes, into digital data,
wherein the scatterer is located between the plurality of types of optical filters and the photodiodes, and
wherein the scatterer includes a material having a first refractive index, and a material having a second refractive index that is different from the first refractive index.

11. An image apparatus comprising:
an optical filter including a first optical filter having first transmittance characteristics and a second optical filter having second transmittance characteristics;
an imaging device including a first photo detector having a first light-receiving surface and a second photo detector having a second light-receiving surface, the first photo detector receiving light through the first light-receiving surface and the second photo detector receiving light through the second light-receiving surface;
a first element including a first portion made from a first material and a first particle made from a second material and being located between the optical filter and the imaging device; and
a second element including a second portion made from the first material and a second particle made from the second material and being located between the optical filter and the imaging device,
wherein (i) a particle size of the first particle is different from a particle size of the second particle, (ii) a second refractive index of the second material is 1.9 or more and is bigger than a first refractive index of the first material, and a difference between the second refractive index and the first refractive index is 0.4 or more, and
(iii) the particle size of the first particle and the particle size of the second particle are in a range from 500 nm to 1000 nm, thereby first light entering the optical filter including a first part of the first light, a second part of the first light, a third part of the first light, and a fourth part of the first light, wherein an optical path of the first part of the first light reaches the first photo detector, through the first optical filter and the first portion and not through the first particle, wherein an optical path of the second part of the first light reaches the second photo detector, through the first optical filter, the first portion, and the first particle, wherein an optical path of the third part of the first light reaches the second photo detector, through the second optical filter and the second portion and not through the second particle, and wherein an optical path of the fourth part of the first light reaches the first photo detector, through the second optical filter, the second portion, and the second particle.

* * * * *